United States Patent
Chen (10) Patent No.: US 8,288,194 B2
(45) Date of Patent: Oct. 16, 2012

(54) METHOD OF FABRICATING THIN FILM TRANSISTOR STRUCTURE

(75) Inventor: Tung Yu Chen, Tainan (TW)

(73) Assignee: Au Optronics Corp., Hsin-Chu (TW)

( * ) Notice: Subject to any disclaimer, the term of this patent is extended or adjusted under 35 U.S.C. 154(b) by 0 days.

(21) Appl. No.: 13/103,395

(22) Filed: May 9, 2011

(65) Prior Publication Data

US 2011/0212606 A1  Sep. 1, 2011

Related U.S. Application Data (62) Division of application No. 12/639,436, filed on Dec. 16, 2009, now Pat. No. 7,960,729, which is a division of application No. 11/053,628, filed on Feb. 8, 2005, now Pat. No. 7,652,285.

(30) Foreign Application Priority Data

Jul. 21, 2004 (TW) ................................. 93121800 A
Oct. 27, 2004 (TW) ................................. 93132620 A (51) Int. Cl.
*H01L 21/00* (2006.01)
(52) U.S. Cl. ...................... 438/70; 257/57; 257/E29.117
(58) Field of Classification Search ................. 438/70; 257/57, E29.117
See application file for complete search history.

(56) References Cited

U.S. PATENT DOCUMENTS

| | | | |
|---|---|---|---|
| 4,523,372 A | 6/1985 | Balda et al. |
| 5,003,356 A | 3/1991 | Wakai et al. |
| 5,198,694 A | 3/1993 | Kwasnick et al. |
| 5,384,271 A | 1/1995 | Kwasnick et al. |
| 5,811,325 A | 9/1998 | Lin et al. |
| 5,923,963 A | 7/1999 | Yamanaka |
| 6,028,652 A | 2/2000 | Dohjo et al. |
| 6,242,758 B1 | 6/2001 | Yamazaki et al. |
| 6,387,740 B1 | 5/2002 | Jen et al. |
| 6,413,846 B1 | 7/2002 | Besser et al. |
| 6,465,286 B2 | 10/2002 | Possin et al. |

FOREIGN PATENT DOCUMENTS

JP  10326748  8/1998

*Primary Examiner* — Bradley K Smith
*Assistant Examiner* — Amar Movva
(74) *Attorney, Agent, or Firm* — Thomas|Kayden (57) ABSTRACT

A method of fabricating a thin film transistor (TFT) is provided. The method comprises the steps of providing a substrate with a gate electrode formed thereon; forming an insulating layer on the substrate and covering the gate electrode; forming an intrinsic amorphous silicon layer (intrinsic a-Si layer) on the insulating layer; forming an etch-stop layer on the intrinsic amorphous silicon layer, and the etch-stop layer positioned correspondingly to the gate electrode; treating the etch-stop layer to form an oxide layer, and the oxide layer covering the etch-stop layer; forming a n+ a-Si layer above the intrinsic amorphous silicon layer, and the n+ a-Si layer covering partial surface of the etch-stop layer and the oxide layer separating a sidewall of the etch-stop layer and the n+ a-Si layer; and forming a conductive layer on the n+ a-Si layer.

9 Claims, 7 Drawing Sheets

METHOD OF FABRICATING THIN FILM TRANSISTOR STRUCTURE

CROSS REFERENCE TO RELATED APPLICATIONS

This application is a divisional application of co-pending U.S. patent application Ser. No. 12/639,436, Dec. 16, 2009, which was a divisional of co-pending U.S. patent application Ser. No. 11/053,628, filed Feb. 8, 2005 and entitled "THIN FILM TRANSISTOR STRUCTURE AND METHOD OF FABRICATING THE SAME", which claims the benefit of Taiwan applications Serial No. 93121800, filed Jul. 21, 2004, and Serial No. 93132620, filed Oct. 27, 2004, the subject matters of which are incorporated herein by reference.

BACKGROUND OF THE INVENTION

1. Field of the Invention

The invention relates in general to a method of fabricating a thin film transistor (TFT) structure, and more particularly to the method of fabricating the thin film transistor structure capable of reducing current leakage.

2. Description of the Related Art

In the recent years, the development of semiconductor technology has really flourished. The size of the semiconductor device is greatly minimized, and the integration of the integrated circuit is thus increasing. When a semiconductor device is operated, instabilities of electrical characteristics are especially noticeable and easy to occur in the device with high integration. Therefore, stability is an important concern while fabricating a device with micro-size. For example, no excessive leakage current is observed when a TFT device is off (i.e. zero applied gate voltage).

Figure 1:
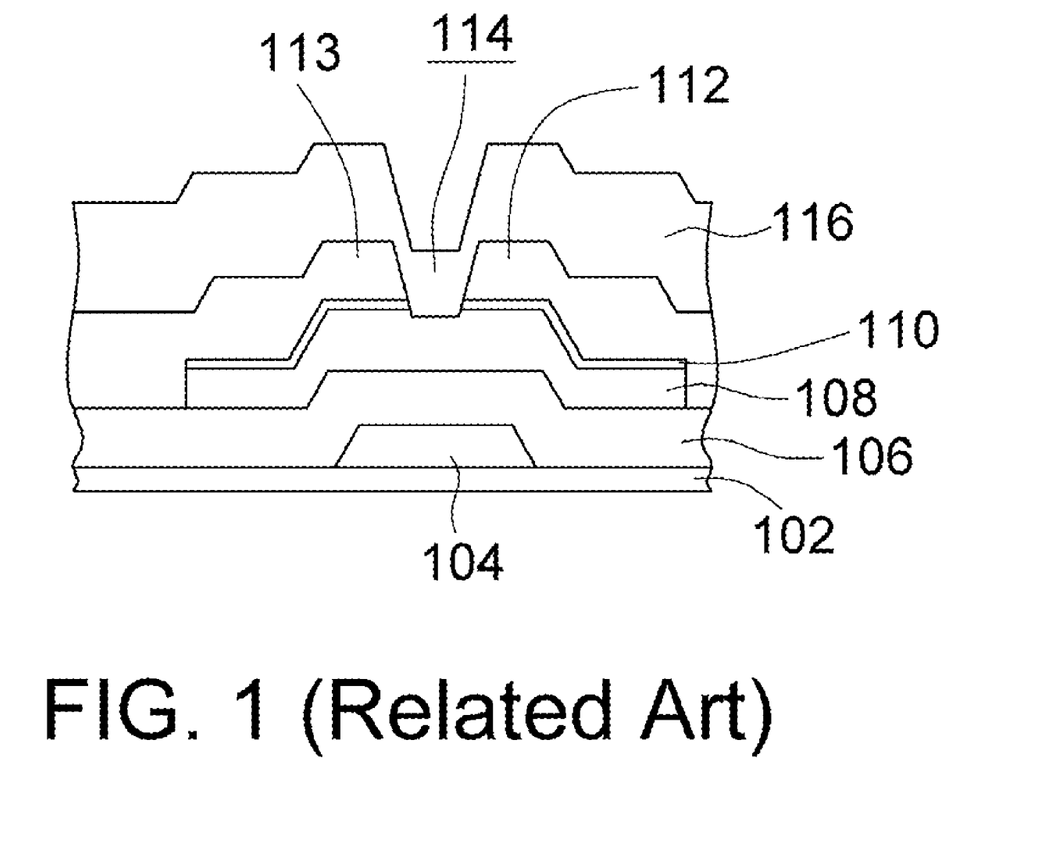
FIG. 1 (related art) is a cross-sectional view of a conventional thin film transistor (TFT) device.

FIG. 1 is a cross-sectional view of a conventional thin film transistor (TFT) device. A gate electrode 104 is formed by the usual photolithography and etched a first metal layer formed on the substrate 120. The first metal layer is generally made of pure aluminum (Al), molybdenum (Mo), an alloy of aluminum and neodymium (AlNd), or a multi-layer made of the materials thereof.

Then, a gate insulation layer 106 is formed on the gate electrode 104. Above the gate insulation layer 106, an amorphous silicon layer (a-Si layer) 108 and an ohmic contact layer such as the n+ a-Si layer 110 are formed in order by the processes of deposition, photolithography and etch.

A second metal layer, made of titanium (Ti), molybdenum (Mo) or chromium (Cr), is then formed above the substrate 102. A source region 112 and a drain region 113 are formed by the usual photolithography and etch of a second metal layer. Also, a channel 114 is formed by opening the portion of the second metal layer relatively to the position of the gate electrode 104, for exposing the amorphous silicon layer 108. The channel 114 separates the source region 112 and the drain region 113.

Next, a passivation layer 116, such as a silicon nitride (SiNx) layer, is deposited over the substrate 102, and covers the source region 112 and the drain region 113. The channel 114 is also filled with the passivation layer 116. Also, a via (not shown in FIG. 1) is formed in the passivation layer 116 to expose the drain region 112, by photolithography and etch steps. Then, a transparent electrode layer (not shown in FIG. 1) is formed on the passivation layer 116, and fills the via. Finally, the transparent electrode layer is patterned by photolithography and etching.

Typically, the amorphous silicon layer 108 contains no dopant or impurity, so as called "intrinsic a-Si layer". The contact between the n+ a-Si layer 110 and the intrinsic a-Si layer 108 is so called N-I junction. In the conventional structure of semiconductor device, electrons tend to flow to the passivation layer 116 in the channel 114 through the N-I junction, so that excessive current leakage appears frequently. This undesirable instability of the semiconductor device is an issue to be solved.

SUMMARY OF THE INVENTION

It is therefore an object of the invention to provide a method of fabricating a thin film transistor (TFT) structure. By forming a spacer layer, stability of TFT is greatly improved due to the removal or minimization of current leakage.

The invention achieves the objects by providing a method of fabricating a thin film transistor (TFT), comprising steps of:

providing a substrate having an insulating surface;

forming an amorphous silicon layer (a-Si layer) on the insulating surface;

forming a conductive layer on the a-Si layer to form a junction layer therebetween;

patterning the conductive layer to form a channel region;

separating the junction layer to form a pair of junction regions between the patterned conductive layer and the a-Si layer;

forming a spacer layer at a sidewall of each junction region; and forming an insulating layer on the channel region.

According to the method, the spacer layer isolates the insulating layer from direct contact with the junction region.

Other objects, features, and advantages of the invention will become apparent from the following detailed description of the preferred but non-limiting embodiments. The following description is made with reference to the accompanying drawings.

DETAILED DESCRIPTION OF THE INVENTION

In the present invention, a spacer layer is formed in the channel for improving the stability of the semiconductor device by reducing the current leakage. A back-channel etching (BCE) type thin film transistor (TFT) fabricating process and structure is described in detail as the first embodiment, and a etch stop type TFT fabricating process and structure is described in detail as the second embodiment.

The embodiments disclosed herein are for illustrating the invention, but not for limiting the scope of the invention. Additionally, the drawings used for illustrating the embodiments of the invention only show the major characteristic parts in order to avoid obscuring the invention. Accordingly, the specification and the drawing are to be regard as an illustrative sense rather than a restrictive sense.

First Embodiment

Back-Channel Etching (BCE) Type TFT Fabricating Process and Structure

Figure 2A:
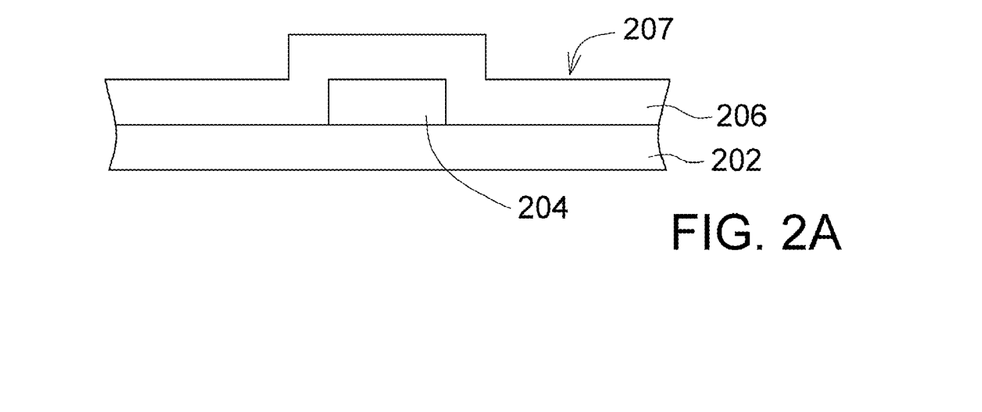
FIG. 2A~FIG. 2E schematically show the steps involved in the method of fabricating the BCE type TFT according to the first embodiment of the invention.

FIG. 2A~FIG. 2E schematically show the steps involved in the method of fabricating the BCE type TFT according to the first embodiment of the invention. First, a substrate 202, such as a transparent plate, is provided, and a patterned first conductive layer (i.e. first metal layer) 204 is formed on the substrate 202. Then, a first insulating layer 206 is formed on the first conductive layer 204, to provide an insulating surface 207 for the substrate 202, as shown in FIG. 2A. The first insulating layer 206, such as a silicon nitride layer to be the gate electrode insulating layer, could be formed on the first conductive layer 204 by chemical vapor deposition (CVD) method.

Figure 2B:
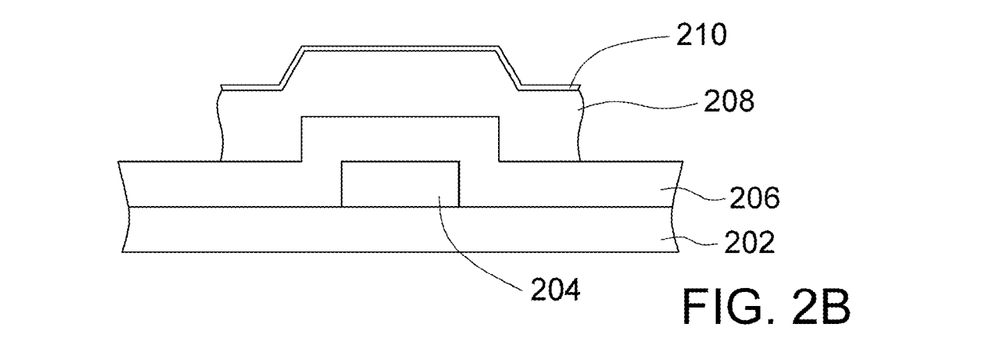

Next, above the first insulating layer 206, an amorphous silicon layer (a-Si layer) 208 and a n+ a-Si layer 210 are formed in order by the processes of deposition, photolithography and etch, as shown in FIG. 2B. Also, the amorphous silicon layer 208 contains no dopant or impurity, so called "intrinsic a-Si layer".

Figure 2C:
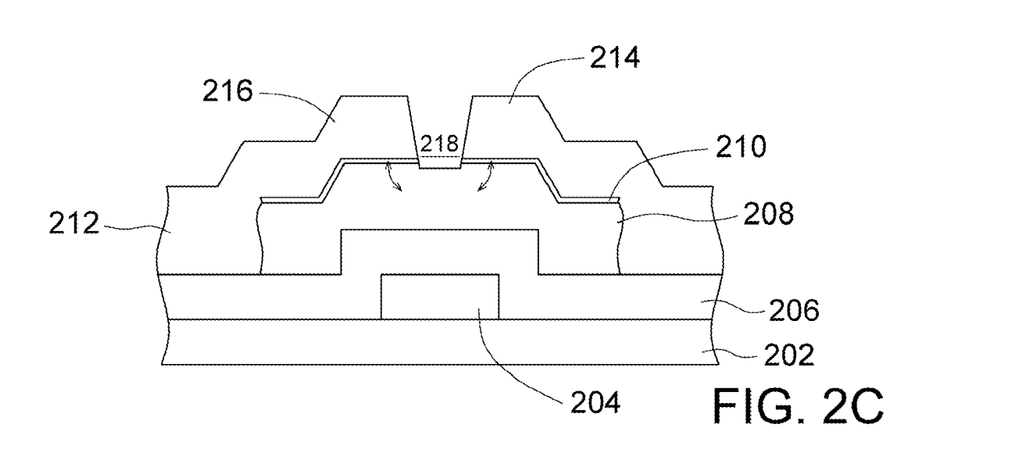

Then, a second conductive layer (i.e. second metal layer) 212, made of titanium (Ti), molybdenum (Mo) or chromium (Cr), is then formed above the amorphous silicon layer 208. After patterning, a drain region 214 and a source region 216 are formed by the usual photolithography and etch of a second conductive layer (i.e. second metal layer) 212. Also, the source region 216 and the drain region 214 are separated by a channel region 218, as shown in FIG. 2C. The channel region 218 is formed by opening the portion of the second conductive layer 212 and exposes the amorphous silicon layer 208, for electrically isolating the n+ a-Si layer 210. Additionally, the contact between the n+ a-Si layer 210 and the n+ (intrinsic) a-Si layer 208 is so called an N-I junction, indicated by the arrows of FIG. 2C.

Figure 2D:
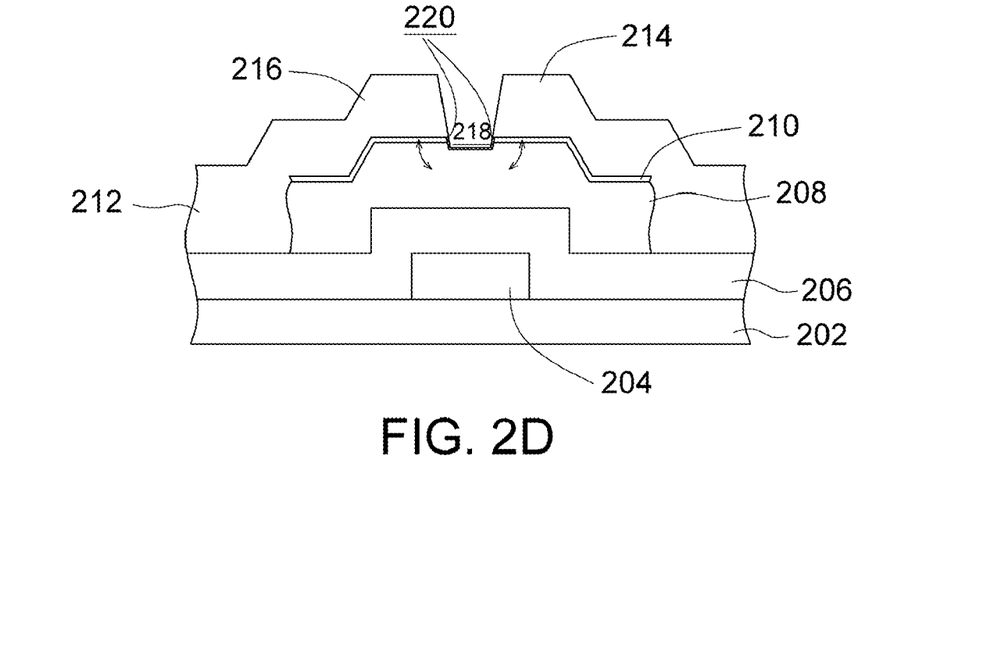

After forming the channel region 218, a spacer layer is formed by subjecting the channel region 218 to a special treatment. For example, the channel region 218 is subjected to an oxygen plasma treatment in order to form an oxide layer 220 (i.e. the spacer layer described before) at the sidewalls near the N-I junctions, as shown in FIG. 2D. The oxygen plasma for treating the channel region 218 could be the oxygen plasma of ashing process, or the ozone plasma in the presence of carbon tetrafluoride ($CF_4$) and sulfur hexafluoride ($SF_6$) gases. The thickness of the oxide layer 220 is ranged from about 10 Å~500 Å, depending on the operating conditions (such as the forming method, treating time, etc.) in the practical applications.

Figure 2E:
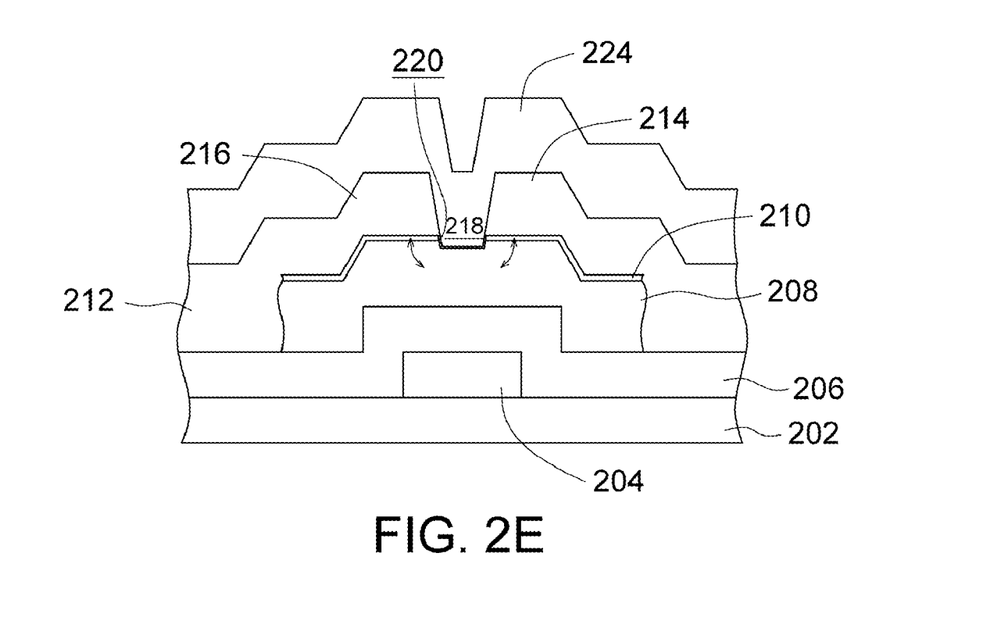

After forming the oxide layer (i.e. the spacer layer) 220, a second insulating layer 224 is formed above the first insulating layer 206, to cover the second conductive layer 212 and fill the channel region 218, as shown in FIG. 2E. The second insulating layer 224, such as a silicon nitride (SiNx) layer, could be formed by chemical vapor deposition (CVD) method.

Figure 3:
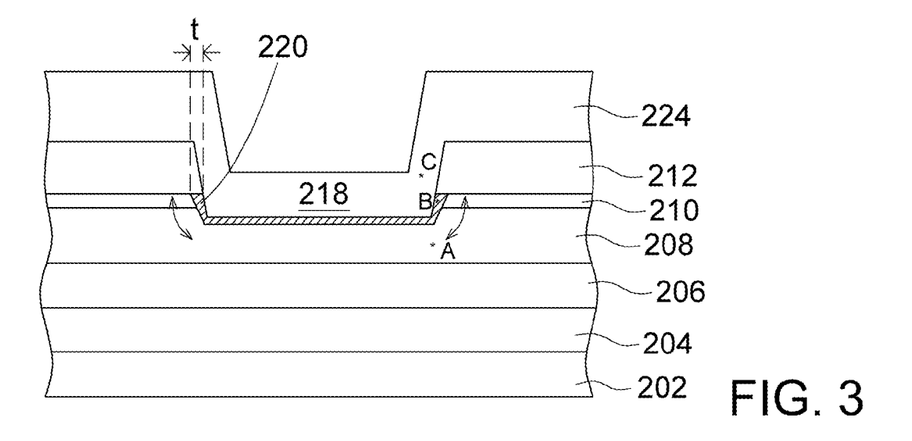
FIG. 3 is a cross-sectional view of a BCE type thin film transistor (TFT) device according to the first embodiment of the invention.

FIG. 3 is a cross-sectional view of a BCE type thin film transistor (TFT) device according to the first embodiment of the invention. The first conductive layer 204 and the first insulating layer 206 are subsequently formed on the substrate 202. The first conductive layer 204 and the first insulating layer 206, for example, are made of aluminum (Al) and silicon nitride (SiNx), respectively. Above the first insulating layer 206, the a-Si layer 208, the n+ a-Si layer 210 and the patterned second conductive layer 212 are laminated in order. Also, the contact between the n+ (intrinsic) a-Si layer 210 and the a-Si layer 208 is so called an N-I junction, indicated by the arrows in FIG. 3. After oxidation treatment by oxygen plasma, an oxide layer 220 is formed at the sidewalls of the N-I junction as the spacer layer. Then, the second insulating layer (also called protection layer or passivation layer) 224 comprises, for example, silicon nitride (SiNx), silicon oxide (SiOx) or silicon oxide nitride (SiOxNy), covers the second conductive layer 212 and fills the channel region 218. Accordingly, the presence of the spacer layer, such as the oxide layer 220 of the first embodiment, prevents the direct contact between the N-I junctions and the second insulating layer 224 comprising nitride.

Experimentation of First Embodiment (A) Experimental Procedures

The method of fabricating TFT device is illustrate in FIG. 2A-2E.

The first insulating layer 206 and the second insulating layer 224 comprise silicon nitride. Also, the channel region 218, exposing the n+ a-Si layer 208, is treated by oxygen plasma.

Ex. (1)—the channel region 218 is subjected to plasma containing oxygen for about 50 seconds.

Ex. (2)—the channel region 218 is subjected to pure oxygen plasma for about 20 seconds.

(B) Experimental Results

Microscopy Inspection

The devices fabricated according to Ex. (1) and Ex. (2) are observed using transmission electron microscopy (TEM). The TEM results of the devices fabricated according to Ex. (1) and Ex. (2) indicated that a spacer layer in a thickness of about 100 Å~120 Å does exist at the sidewalls of the N-I junction of each device.

EDX Analysis

The a-Si layer 208, the spacer layer and the silicon nitride layer 224 of the devices fabricated according to Ex. (1) and Ex. (2) are analyzed by energy dispersive X-ray (EDX) spectrometry. This analytical tool, EDX, allows simultaneous non-destructive elemental analysis of the sample. The sampling portions of the a-Si layer 208, the spacer layer and the silicon nitride layer 224 are represented as points A, B, and C of FIG. 3, respectively. The EDX results are listed in Table 1.

TABLE 1

| | Point A (sampling from the a-Si layer 208) | Point B (sampling from the layer 220) | Point C (sampling from the SiN layer 224) |
|---|---|---|---|
| Ex. (1) | O/Cu: 0.302 | O/Cu: 0.359 | O/Cu: 0.063 |
| Ex. (2) | O/Cu: 0.159 | O/Cu: 0.217 | O/Cu: 0.014 |

The EDX results of Ex. (1) and Ex. (2) indicated that the sampling portion of the device, represented as point B (i.e. portion of the spacer layer), is oxide rich (i.e. does contain higher element ratio of oxygen). Therefore, it is proved that the spacer layer substantially comprises an oxide layer 220.

Surface Analysis

Figure 4:
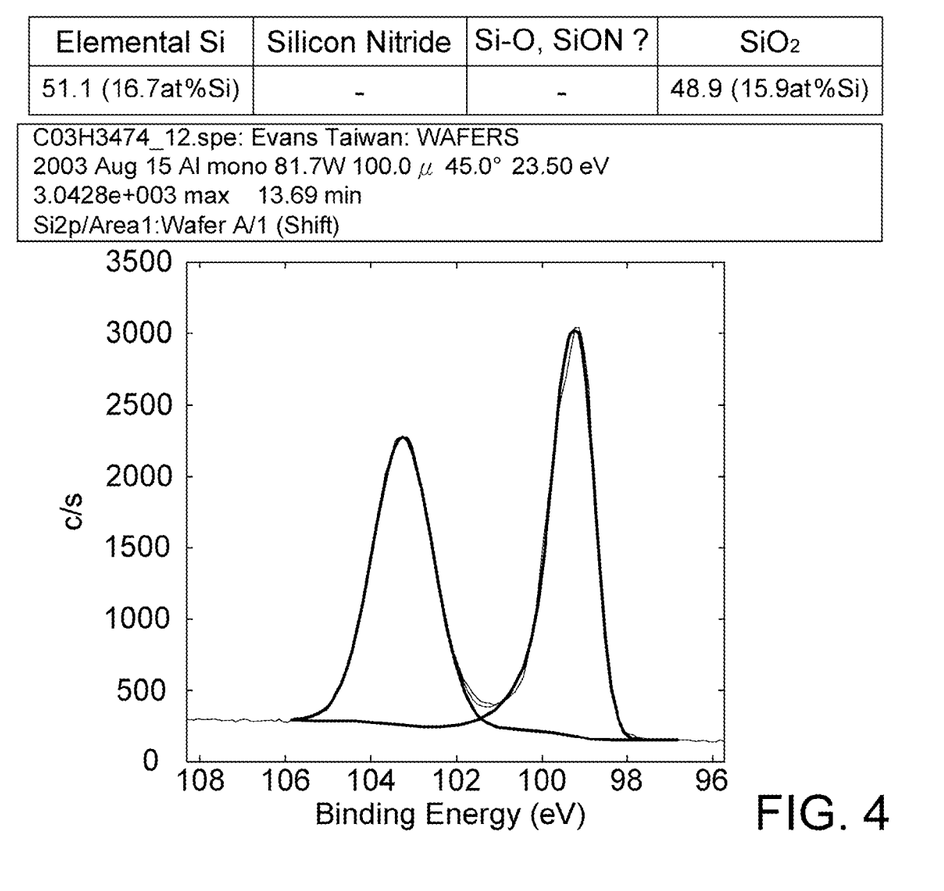
FIG. 4 is an ESCA result of the spacer layer fabricated according to the first embodiment of the invention.

A substrate deposited with an a-Si layer (about 1500 Å) is provided. Then, plasma treatment as described in the first embodiment is used for treating the surface of the a-Si layer, and a thin film is thus formed on the a-Si layer. The thin film surface is then irradiated by electron spectroscopy for chemical analysis, and the result is shown in FIG. 4. Generally, Electron Spectroscopy for Chemical Analysis (ESCA), also referred to as X-ray Photoelectron Spectroscopy (XPS), irradiates the sample surface with a soft (low energy) X-ray. This X-ray excites the electrons of the sample atoms and if their binding energy is lower than the X-ray energy, they will be emitted from the parent atom as a photoelectron. Only the photoelectrons at the extreme outer surface (10-100 Angstroms) can escape the sample surface.

The ESCA result of FIG. 4 indicated that the thin film comprises the chemical bond of Si—O (silicon-oxygen). In accordance with the peaks of ESCA spectrum (produced by the binding energies of the photoelectrons) and the binding energy shift, it is determined that the chemical compound of this thin film is silicon oxide ($SiO_2$).

According to the experimental results of the first embodiment, it has been proved that an oxide layer comprising silicon can be formed at the sidewalls of the N-I junction of the applied TFT device to be a spacer layer, so as to prevent the direct contact between the N-I junction and the insulating layer comprising nitride.

Second Embodiment

Etch Stop Type TFT Fabricating Process and Structure

Figure 5A:
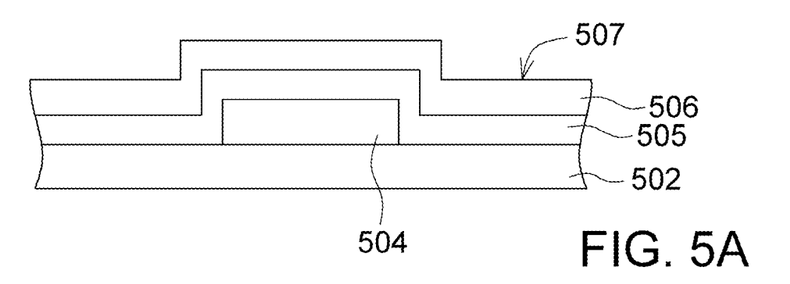
FIG. 5A~FIG. 5D schematically show the steps involved in the method of fabricating the etch stop type TFT according to the second embodiment of the invention.

FIG. 5A~FIG. 5D schematically show the steps involved in the method of fabricating the etch stop type TFT according to the second embodiment of the invention. First, a substrate 502, such as a transparent plate, is provided, and a patterned first conductive layer (i.e. first metal layer) 504 is formed on the substrate 502. A first metal layer made of pure aluminum (Al) and alloy of Al and neodymium (Nd) could be formed on the substrate 502 and then etched to form the patterned first conductive layer 504. Next, an insulating film is formed on the first conductive layer 504, to provide an insulating surface 507 for the substrate 502. According to the second embodiment, the first insulating film comprises a silicon oxide nitride (SiOxNy) layer 505 formed on the first conductive layer 504, and a silicon nitride (g-SiNx) layer 506 formed on the SiOxNy layer 505 as the gate electrode insulating layer, as shown in FIG. 5A. Also, the insulating film could be formed by chemical vapor deposition (CVD) method.

Figure 5B:
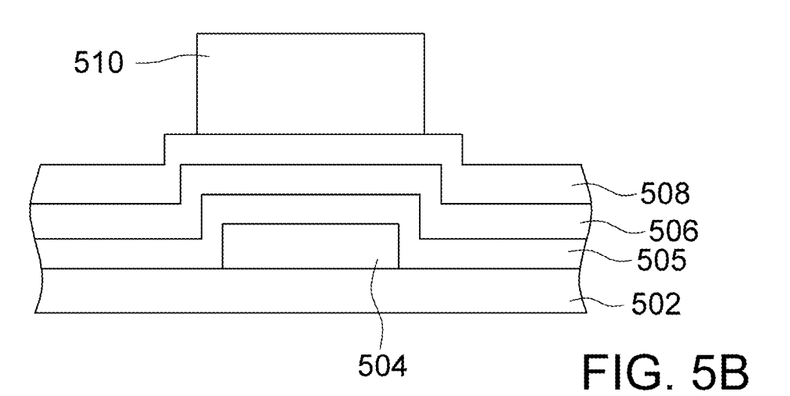

Next, above the silicon nitride layer 506, an amorphous silicon layer (a-Si layer) 508 is formed in order by the processes of deposition, photolithography and etch. Then, a patterned etch stop layer 510 is formed above the a-Si layer 508, as shown in FIG. 5B. The amorphous silicon layer 508 contains no dopant or impurity, so called "intrinsic a-Si layer". Also, the patterned etch stop layer 510 could be a silicon nitride (SiNx) layer.

Figure 5C:
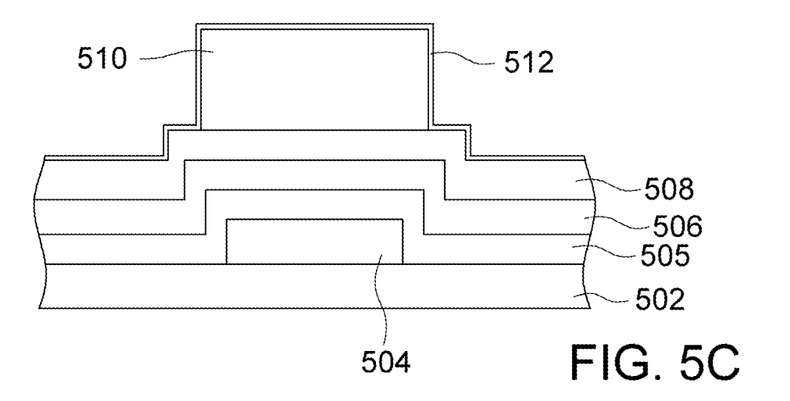
Figure 5D:
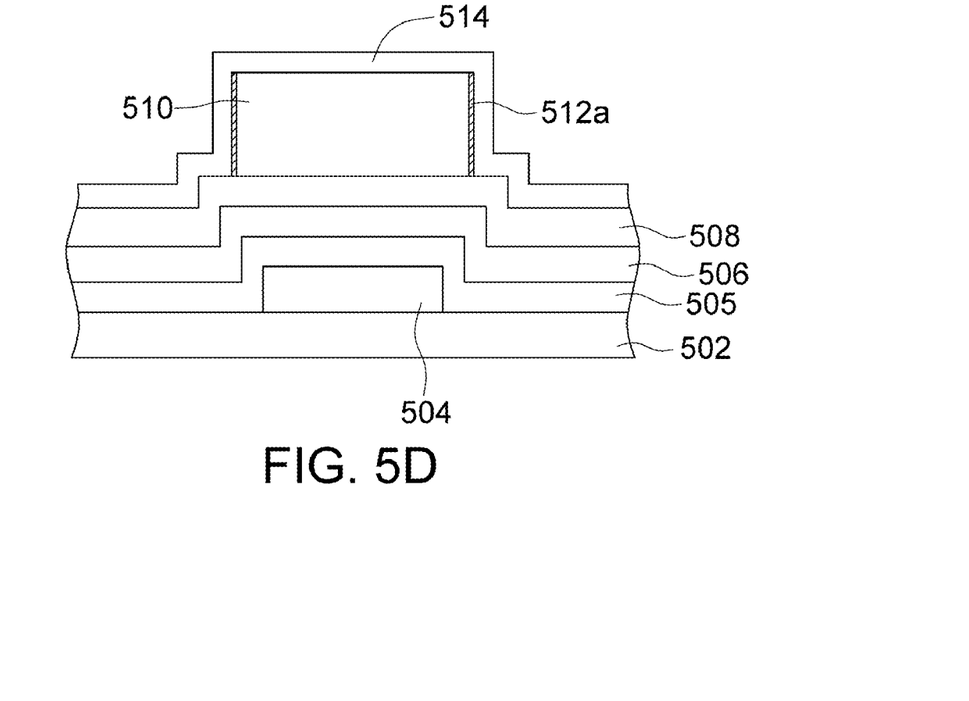

Afterward, a spacer layer is formed by, for example, an ozone ($O_3$) plasma treatment. As shown in FIG. 5C, an oxide layer 512 is formed on the a-Si layer 508. Then, the portions of the oxide layer 512 formed on the top of the etch stop layer 510 and formed on the surface of the a-Si layer 508 are removed using hydrogen ($H_2$) plasma; therefore, the portions of the oxide layer 512a formed at two sides of the etch stop layer 510 are remained, as shown in FIG. 5D. Subsequently, an n+ a-Si layer 514 is formed on the etch stop layer 510 and covers the a-Si layer 508. Moreover, partial removal of the oxide layer 512 using $H_2$ plasma increases the ohmic contact between the a-Si layer 508 and n+ a-Si layer 514.

Before forming the spacer layer by $O_3$ plasma treatment, hydrofluoric acid (HF), such as a diluted HF solution or a buffer composed of HF and ammonium fluoride ($NH_4F$), could be used to pre-clean the native oxide on the surface of the silicon wafer.

The contact between the a-Si layer 508 and the n+ (intrinsic) a-Si layer 514 is so called an N-I junction. As shown in FIG. 5D, the TFT device fabricated according to the method disclosed in the second embodiment also has a spacer layer (i.e. the oxide layer 512a) for preventing the direct contact between the N-I junction and the insulating layer (i.e. the etch stop layer 510).

Then, a second conductive layer 516, for example, made of titanium (Ti), molybdenum (Mo) or chromium (Cr), is then formed above the n+ a-Si layer 514. After patterning, a drain region and a source region are formed by the usual photolithography. The source region and the drain region are separated by a channel region 517. The channel region 517 cuts through the n+ a-Si layer 514 and exposes the etch stop layer 510. Then, an insulating layer 518 comprises silicon nitride (SiNx), silicon oxide (SiOx), silicon oxide nitride (SiOxNy) or other material comprising chemical bond of Si—Si, is formed to cover the second conductive layer 516 and fill the channel region 517, as shown in FIG. 6.

Figure 6:
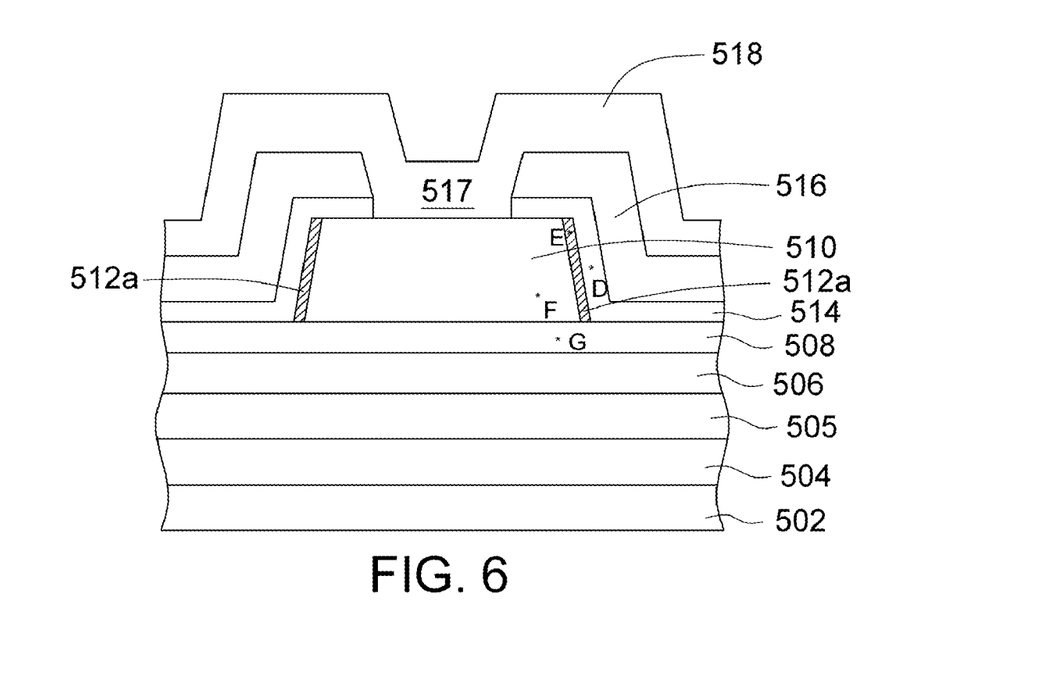
FIG. 6 is a cross-sectional view of an etch stop type thin film transistor (TFT) device according to the second embodiment of the invention.

FIG. 6 is a cross-sectional view of an etch stop type thin film transistor (TFT) device according to the second embodiment of the invention. The first conductive layer 504 and the insulating film comprising the SiOxNy layer 505 and the SiOx layer 506 are subsequently formed on the substrate 502. The a-Si layer 508 and the patterned etch stop layer 510 are laminated above the SiOx layer 506. After oxygen plasma and hydrogen plasma treatments, the oxide layer 512a formed at the sidewalls of the N-I junction is used as the spacer layer. Then, the patterned n+ a-Si layer 514 and the second conductive layer 516 are formed above the etch stop layer 510. Next, the insulating layer 518, such as a silicon nitride (SiNx) layer, covers the second conductive layer 516 and fills the channel region 517. Accordingly, the presence of the spacer layer, such as the oxide layer 512a of the second embodiment, prevents the direct contact between the N-I junctions and the insulating layer comprising nitride (i.e. the etch stop layer 510). The thickness of the oxide layer 512a is ranged from about 10 Å~500 Å, depending on the operating conditions (such as the forming method, treating time, etc.) in the practical applications.

Experimentation of Second Embodiment (A) Experimental Procedures

The method of fabricating TFT device is illustrated in FIG. 5A~5D.

After forming the patterned etch stop layer 510, a buffering solution composed of HF (in a concentration of 0.14%~0.2%) and $NH_4F$ (in a concentration of 16.5%~17.5%) is used to pre-clean the native oxide grown on the surface of the a-Si layer 508 for about 27 seconds. Subsequently, the structure is subjected to ozone water for about 30 seconds (to grow the oxide layer 512 on the a-Si layer 508, as shown in FIG. 5C). Then, the structure is treated by hydrogen plasma to configure the spacer layer at the sidewalls of the etch stop layer 510 (i.e. the oxide layer 512a as shown in FIG. 5D).

(B) Experimental Results

Microscopy Inspection

The device is observed using transmission electron microscopy (TEM). The TEM result indicated that a spacer layer in a thickness of about 200 Å does distinctively exist between the etch stop layer 510 and the N-I junction.

EDX Analysis

The n+ a-Si layer 514, the spacer layer, the etch stop layer (silicon nitride layer) 510 and the a-Si layer 508 are analyzed by energy dispersive X-ray (EDX) spectrometry. The sampling portions of the n+ a-Si layer 514, the spacer layer, the etch stop layer 510 and the a-Si layer 508 are represented as points D, E, F and G of FIG. 6, respectively. The EDX results are listed in Table 2.

TABLE 2

| D (sampling from the n+ a-Si layer 514) | E (sampling from the layer 512) | F (sampling from the SiN layer 510) | G (sampling from the a-Si layer 508) |
|---|---|---|---|
| O/Cu: 0.057 | O/Cu: 0.115 | O/Cu: 0.041<br>N/Cu: 0.349 | O/Cu: 0.063 |

The EDX results indicated that the sampling portion of the device represented as point E is oxide rich (i.e. does contain higher element ratio of oxygen). Therefore, it is proved that the spacer layer formed according to the method disclosed in the second embodiment substantially comprises an oxide layer.

Surface Analysis

A substrate deposited with an a-Si layer (about 3500 Å) is provided. Then, plasma treatment as described in the second embodiment is used for treating the surface of the a-Si layer, and a thin film is thus formed on the a-Si layer. The thin film surface is then irradiated by electron spectroscopy for chemical analysis (ESCA), and the ESCA result is shown in FIG. 7.

Figure 7:
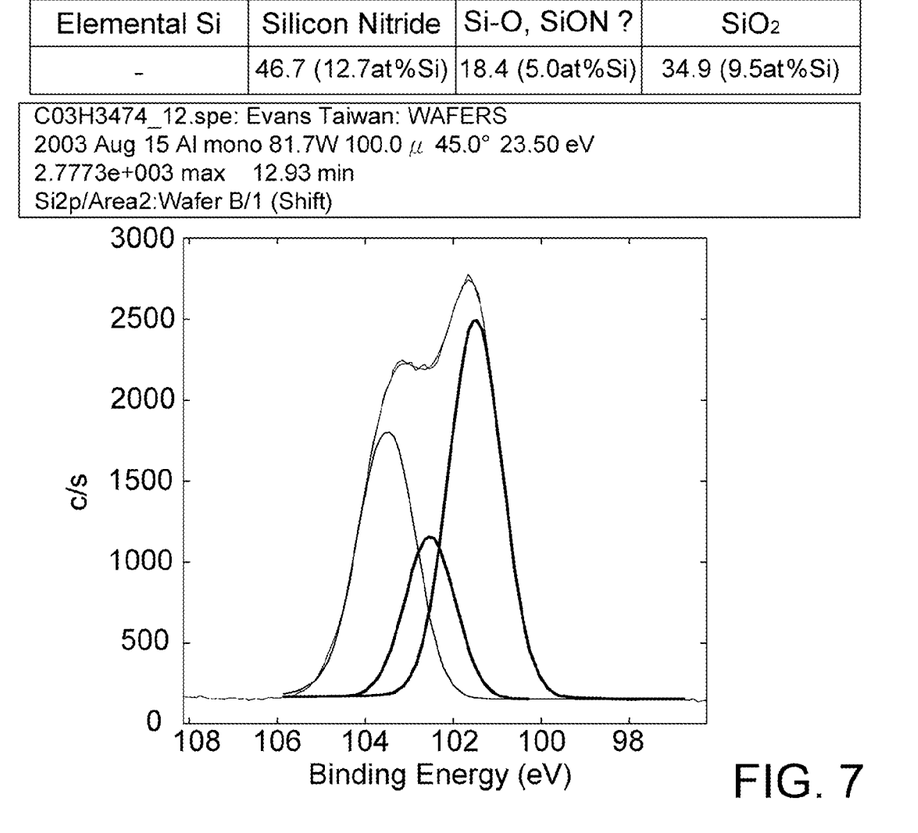
FIG. 7 is an ESCA result of the spacer layer fabricated according to the second embodiment of the invention.

The ESCA result of FIG. 7 indicated that the thin film comprises the chemical bond of Si—O (silicon-oxygen). In accordance with the peaks of ESCA spectrum (produced by the binding energies of the photoelectrons) and the binding energy shift, it is determined that the chemical compound of this thin film is composed of silicon monoxide (SiO), silicon oxide ($SiO_2$) and silicon oxide nitride (SiOxNy).

According to the experimental results of the second embodiment, it has been proved that an oxide layer can be formed at the sidewalls of the N-I junction of the TFT device to be a spacer layer, so as to prevent the direct contact between the N-I junction and the insulating layer comprising nitride (i.e. the etch stop layer).

Electrical Properties Analysis

Figure 8:
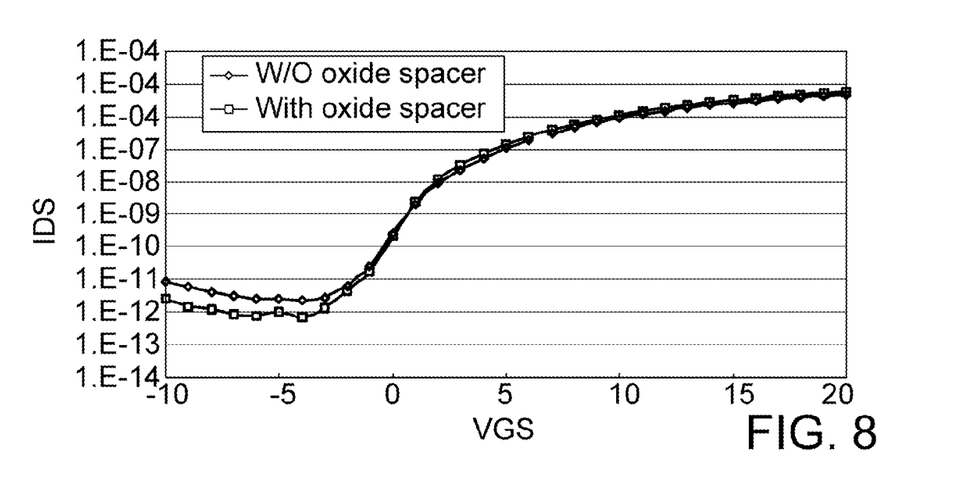
FIG. 8 is a diagram showing the electrical characteristics of the TFT device according to the embodiment of the invention.

FIG. 8 is a diagram showing the electrical characteristics of the TFT device according to the embodiment of the invention. The -□- curve represents the result of the TFT device having a spacer layer. The -♦- curve represents the result of the TFT device without a spacer layer. The result indicated that the spacer layer (such as the oxide layers 220 and 512a) isolating the N-I junction and the insulating layer comprising nitride does decrease the amount of leakage current, for at least $10^{0.5}$.

According to the aforementioned description, the TFT structure having a spacer layer fabricated according to the method of the invention can prevent the direct contact between the N-I junction and the insulating layer comprising nitride. The existence of the spacer layer effectively reduces the amount of current leakage, and improves the electrical characteristics of the TFT structure.

While the invention has been described by way of examples and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a thin film transistor (TFT), comprising the steps of:
   providing a substrate with a gate electrode formed thereon;
   forming an insulating layer on the substrate and covering the gate electrode;
   forming an intrinsic amorphous silicon layer (intrinsic a-Si layer) on the insulating layer;
   forming an etch-stop layer on the intrinsic amorphous silicon layer, and the etch-stop layer positioned correspondingly to the gate electrode;
   forming an oxide layer, at two sides of the etch-stop layer;
   forming a n+ a-Si layer above the intrinsic amorphous silicon layer, and the n+ a-Si layer covering a partial surface of the etch-stop layer and the oxide layer separating a sidewall of the etch-stop layer and the n+ a-Si layer; and
   forming a conductive layer on the n+ a-Si layer.

2. The method according to claim 1, where an oxide film is formed on the intrinsic a-Si layer by an oxygen plasma and covers the etch-stop layer, and portions of the oxide film formed on top of the etch stop layer and formed on surface of the intrinsic a-Si layer are removed to form the oxide layer at two sides of the etch-stop layer.

3. The method according to claim 1, where an oxide film is formed on the intrinsic a-Si layer by ozone water and covers the etch-stop layer, and portions of the oxide film formed on top of the etch stop layer and formed on surface of the intrinsic a-Si layer are removed to form the oxide layer at two sides of the etch-stop layer.

4. The method according to claim 1, where an oxide film is formed on the intrinsic a-Si layer by an ozone plasma and a fluoride-bearing liquid and covers the etch-stop layer, and portions of the oxide film formed on top of the etch stop layer and formed on surface of the intrinsic a-Si layer are removed to form the oxide layer at two sides of the etch-stop layer.

5. The method according to claim 4, wherein the etch-stop layer is treated for about 30 seconds, so as to form the oxide layer between the etch-stop layer and the n+ a-Si layer in a thickness of 200 Å, approximately.

6. The method according to claim 1, wherein the oxide layer is selected from the group consisting of silicon monoxide (SiO), silicon oxide (SiO2), and silicon oxide nitride (SiOxNy).

7. The method according to claim 1, wherein the insulating layer is formed by:
   forming a silicon oxide nitride (SiOxNy) layer on the substrate; and
   forming a silicon nitride (SiNx) layer on the silicon oxide nitride layer.

8. The method according to claim 1, wherein step of forming the oxide layer comprises:
   forming an oxide film on the intrinsic a-Si layer and covering the etch-stop layer; and
   removing portions of the oxide film formed on top of the etch stop layer and formed on surface of the intrinsic a-Si layer, so as to form the oxide layer at two sides of the etch-stop layer.

9. The method according to claim 8, wherein portions of the oxide film are removed using hydrogen ($H_2$) plasma.

* * * * *